(12) United States Patent
Yeh

(10) Patent No.: US 12,550,748 B2
(45) Date of Patent: Feb. 10, 2026

(54) SEMICONDUCTOR DEVICE INCLUDING MARK STRUCTURE FOR MEASURING OVERLAY ERROR AND METHOD FOR MANUFACTURING THE SAME

(71) Applicant: NANYA TECHNOLOGY CORPORATION, New Taipei (TW)

(72) Inventor: Chih-Hsuan Yeh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 618 days.

(21) Appl. No.: 17/880,867

(22) Filed: Aug. 4, 2022

(65) Prior Publication Data

US 2024/0047368 A1   Feb. 8, 2024

(51) Int. Cl.
*H01L 23/544* (2006.01)
*G03F 7/00* (2006.01)

(52) U.S. Cl.
CPC ........ *H01L 23/544* (2013.01); *G03F 7/70633* (2013.01); *H01L 2223/54426* (2013.01)

(58) Field of Classification Search
CPC ......... H01L 23/544; H01L 2223/54426; G03F 7/70633
USPC ........................................................ 257/797
See application file for complete search history.

(56) References Cited

U.S. PATENT DOCUMENTS

| | | | |
|---|---|---|---|
| 2003/0061958 A1* | 4/2003 | Zhang | H01L 21/76813 101/463.1 |
| 2007/0063317 A1* | 3/2007 | Kim | G03F 7/70633 257/E23.179 |
| 2007/0292776 A1 | 12/2007 | Cho et al. | |
| 2023/0064001 A1* | 3/2023 | Chien | H01L 22/12 |

FOREIGN PATENT DOCUMENTS

TW   201741776 A   12/2017
TW   202215498 A   4/2022

OTHER PUBLICATIONS

Office Action and and the search report mailed on Jan. 15, 2025 related to Taiwanese Application No. 112105046.
Office Action and and the search report mailed on Jan. 16, 2025 related to Taiwanese Application No. 112143205.
(Continued)

*Primary Examiner* — Norman D Richards
*Assistant Examiner* — Colin Russell McCutcheon
(74) *Attorney, Agent, or Firm* — Xuan Zhang

(57) ABSTRACT

A semiconductor device and method for manufacturing the same are provided. The semiconductor device includes a substrate, a first pattern and a second pattern. The first pattern is disposed on the substrate. The first pattern includes a first segment and a second segment, each of which extends along a first direction. The second pattern is disposed on the first pattern. The second pattern includes a first part extending along a second direction different from the first direction. The first part of the second pattern overlaps the first segment and the second segment along a third direction different from the first direction and the second direction. The first pattern and the second pattern are associated with an overlay error.

11 Claims, 16 Drawing Sheets

(56) References Cited

OTHER PUBLICATIONS

Summary translation of Office Action and and the search report mailed on Jan. 15, 2025 related to Taiwanese Application No. 112105046, and Summary translation of Office Action and and the search report mailed on Jan. 16, 2025 related to Taiwanese Application No. 112143205.
Office Action and and the search report mailed on May 22, 2025 related to U.S. Appl. No. 18/204,538.

* cited by examiner

SEMICONDUCTOR DEVICE INCLUDING MARK STRUCTURE FOR MEASURING OVERLAY ERROR AND METHOD FOR MANUFACTURING THE SAME

TECHNICAL FIELD

The present disclosure relates to a semiconductor device, and more particularly, to a semiconductor device including a mark structure for measuring an overlay.

DISCUSSION OF THE BACKGROUND

As the semiconductor industry develops, reducing overlay errors in photoresist patterns and underlying patterns in lithography operations is becoming much more important. Since correctly measuring overlay errors has become more difficult due to various factors such as a systematic error between a current layer and a pre-layer of an overlay mark structure, a new semiconductor device and method which can more precisely measure overlay errors are developed.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device. The semiconductor device includes a substrate, a first pattern and a second pattern. The first pattern is disposed on the substrate. The first pattern includes a first segment and a second segment, each of which extends along a first direction. The second pattern is disposed on the first pattern. The second pattern includes a first part extending along a second direction different from the first direction. The first part of the second pattern overlaps the first segment and the second segment along a third direction different from the first direction and the second direction. The first pattern and the second pattern are associated with an overlay error.

Another aspect of the present disclosure provides a semiconductor device. The semiconductor device includes a substrate, a conductive layer, a conducive contact, a first pattern, and a second pattern. The substrate has a first region and a second region. The conductive layer is disposed over the first region of the substrate and at a first horizontal level. The conductive contact is disposed over the conductive layer and at a second horizontal level higher than the first horizontal level. The first pattern is disposed over the second region of the substrate and at the first horizontal level. The second pattern is disposed over the first pattern and at the second horizontal level. The conductive contact has a first dimension, and the second pattern has a second dimension different from the first dimension.

Another aspect of the present disclosure provides a method for manufacturing a semiconductor device. The method includes providing a substrate. The method also includes forming a first pattern on the substrate. The first pattern includes a first segment and a second segment, each of which extends along a first direction. The method further includes forming a second pattern on the first pattern. The second patter includes a first part extending along a second direction different from the first direction. The first part of the second pattern overlaps the first segment and the second segment along a third direction different from the first direction and the second direction. The first pattern and the second pattern are associated with an overlay error.

In some embodiments, the first pattern and the second pattern collectively define the overlay error along the second direction.

In some embodiments, the first pattern comprises a metallization layer, and the second pattern comprises a hole exposing the metallization layer.

In some embodiments, the first part of the second pattern continuously extends across the first segment and the second segment of the first pattern.

In some embodiments, the first part of the second pattern comprises a first dimension along the first direction and a second dimension along the second direction, and the second dimension exceeds the first dimension.

In some embodiments, the method further comprises: forming a conductive layer, wherein the conductive layer is located at a first horizontal level, and the first pattern is located at the first horizontal level.

In some embodiments, the method further comprises: forming conductive contacts over the conductive layer, wherein each of the conductive contacts is located at a second horizontal level higher than the first horizontal level, and the second pattern is located at the second horizontal level.

In some embodiments, the conductive contacts has a first pitch along the first direction, the second pattern has a second pitch along the first direction, and the first pitch is substantially the same as the second pitch.

In some embodiments, the second pattern further comprises a second part aligned with the first part along the second direction, and wherein a first distance between the first segment and the second segment of the first pattern exceeds than a second distance between the first part and the second part of the second pattern.

The embodiments of the present disclosure provide a semiconductor device including an overlay mark structure. The overlay mark structure includes the metallization layers as a pre-layer. The overlay mark structure includes openings, defined by a dielectric layer, as the current layer. The pre-layer and the current layer may be free of systematic error when measuring an overlay error between a metal zero (M0) layer such as the conductive layer and a C0 layer such as the conductive contact over th metal zero layer.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers Referring to similar elements throughout the Figures, and:

DETAILED DESCRIPTION

Figure 1:
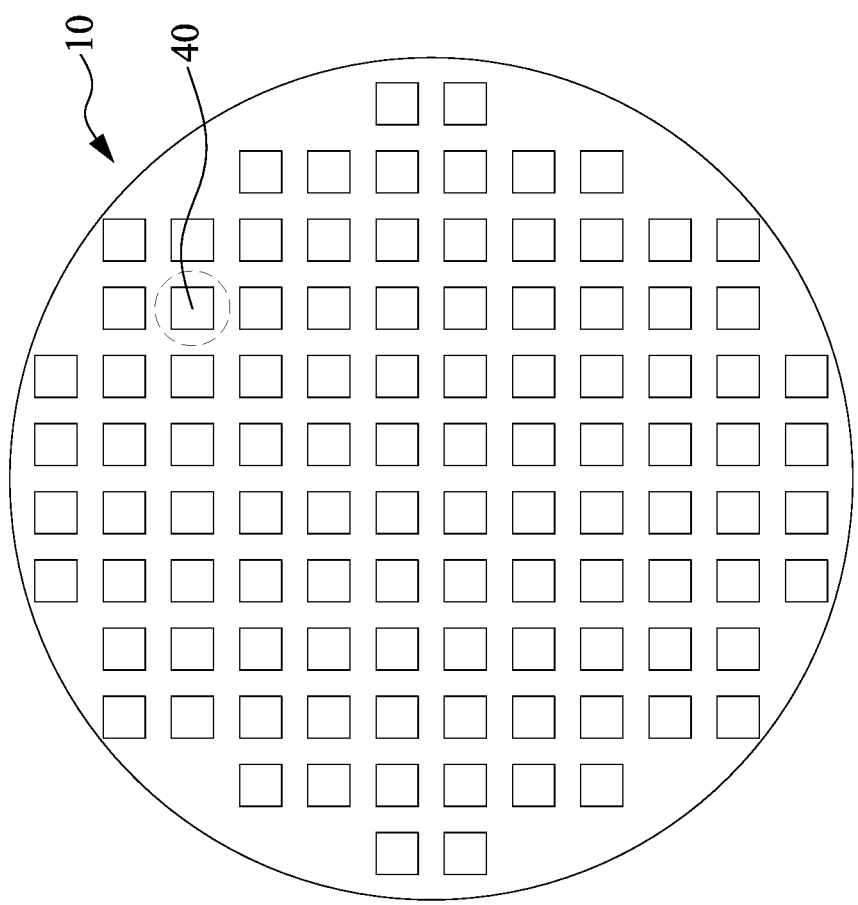
FIG. 1 is a top view of a wafer, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
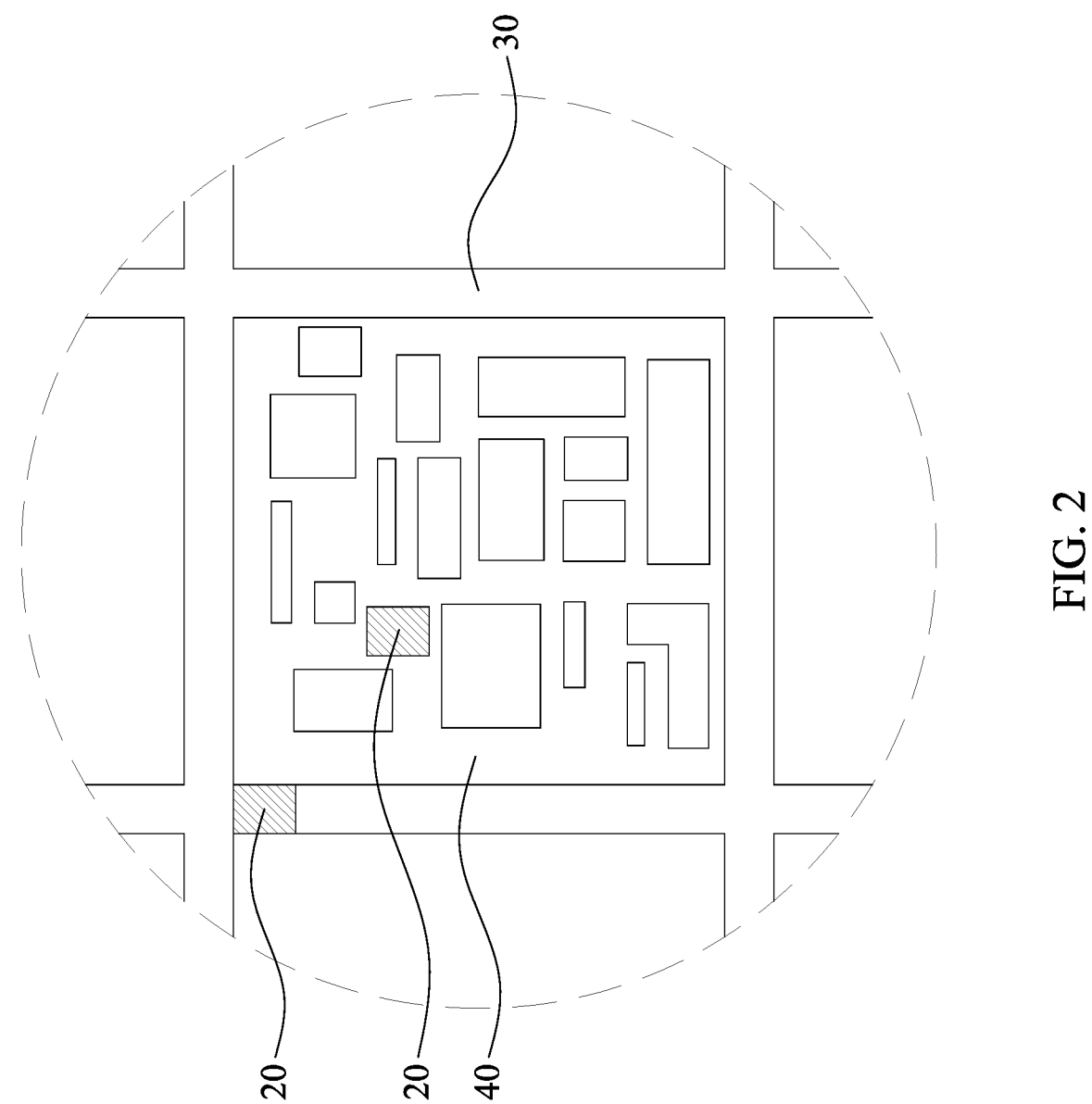
FIG. 2 is an enlargement view of a dotted region as shown in FIG. 1, in accordance with some embodiments of the present disclosure.

Referring to FIG. 1 and FIG. 2, FIG. 1 is a top view of a wafer 10 according to various aspects of the present disclosure, and FIG. 2 is a top view of the enlargement of a dotted region in FIG. 1.

As shown in FIG. 1 and FIG. 2, the wafer 10 is sawed along scribe lines 30 into a plurality of dies 40. Each of the dies 40 may include semiconductor devices, which can include active components and/or passive components. The active component may include a memory die (e.g., dynamic random access memory (DRAM) die, a static random access memory (SRAM) die, etc.), a power management die (e.g., power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The passive component may include a capacitor, a resistor, an inductor, a fuse or other passive components.

As shown in FIG. 2, overlay mark structures 20 may be disposed on the wafer 10. In some embodiments, the overlay mark structures 20 may be located on the scribe lines 30. The overlay mark structures 20 may be disposed at the corner of an edge of each of the dies 40. In some embodiments, the overlay mark structures 20 may be located inside the die 40. In some embodiments, the overlay mark structures 20 may be utilized to measure whether the current layer, such as a hole of an etched layer, is precisely aligned with a pre-layer in the semiconductor fabrication process. In some embodiments, the overlay mark structures 20 are associated with an overlay error between a current layer (or an upper layer) and a pre-layer (or a lower layer). In some embodiments, the overlay mark structures 20 may be utilized to generate an overlay error between a current layer (or an upper layer) and a pre-layer (or a lower layer).

Figure 3:
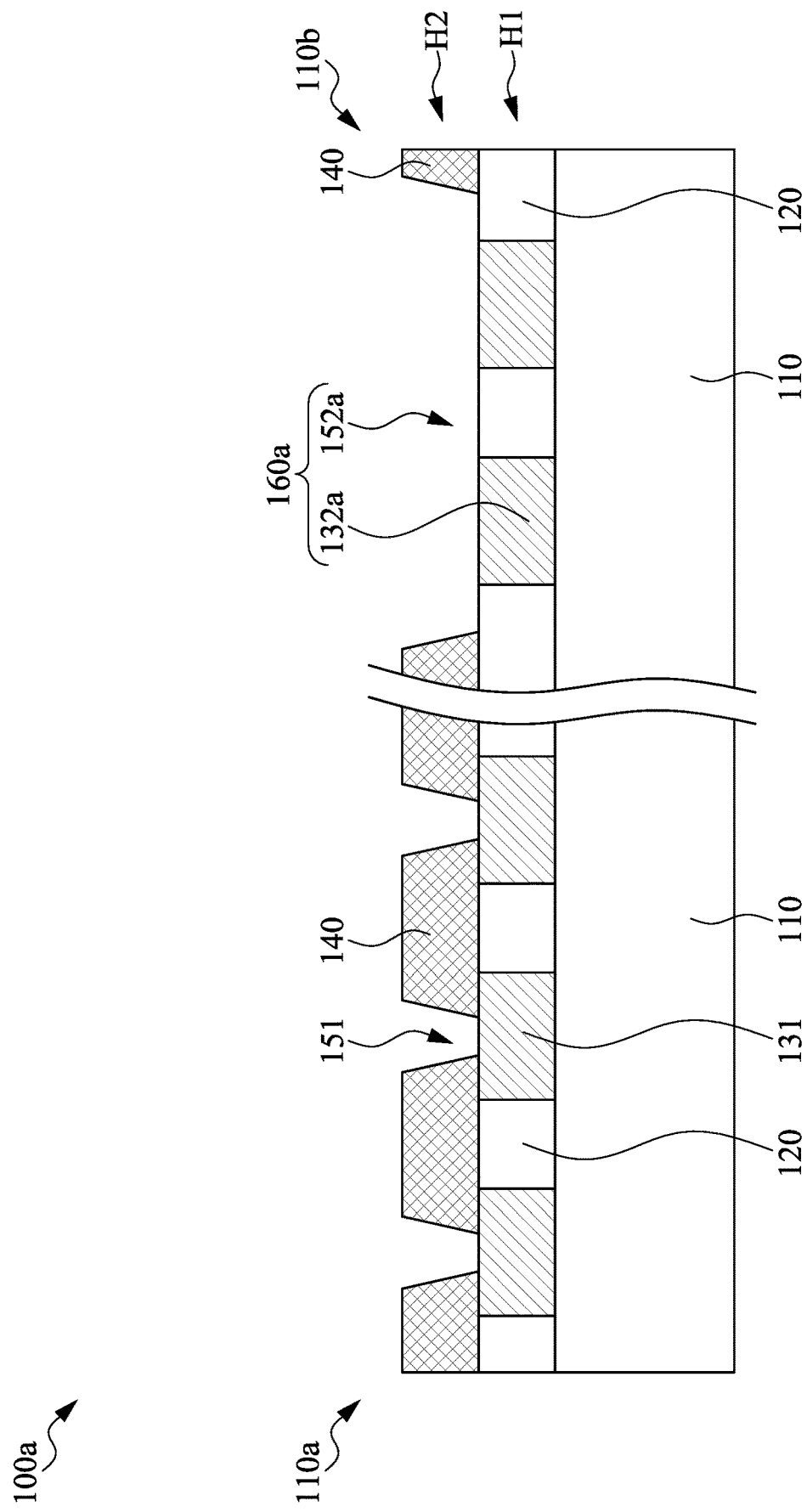
FIG. 3 is a cross-sectional view of a semiconductor device, in accordance with some embodiments of the present disclosure.

FIG. 3 is a cross-sectional view of a semiconductor device 100a, in accordance with some embodiments of the present disclosure.

In some embodiments, the semiconductor device 100a may include a substrate 110. The substrate 110 may include a region 110a and a region 110b. In some embodiments, the region 110a may be utilized to define an area on which integrated circuits are formed. In some embodiments, the region 110b may be utilized to define an area on which an overlay mark structure is formed.

The substrate 110 may be a semiconductor substrate, such as a bulk semiconductor, a semiconductor-on-insulator (SOI) substrate, or the like. The substrate 110 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 110 may have a multilayer structure, or the substrate 110 may include a multilayer compound semiconductor structure.

Further, some features, such as gate electrode, source/drain feature, and/or other features (not shown) may be formed on or within the substrate 110.

In some embodiments, the semiconductor device 100a may include a dielectric layer 120. The dielectric layer 120 may be disposed on or over the region 110a of the substrate 110. The dielectric layer 120 may be disposed on or over the region 110b of the substrate 110. The dielectric layer 120 may include one or more layers made of insulating material, such as silicon oxide or silicon nitride.

In some embodiments, the semiconductor device 100a may include a conductive layer 131. In some embodiments, the conductive layer 131 may be disposed on or over the region 110a of the substrate 110. In some embodiments, the conductive layer 131 may be located at a horizontal level H1. In some embodiments, the conductive layer 131 may be the metal zero (M0) layer, metal first (M1) layer, metal second (M2) layer, and so on. The conductive layer 131 may be disposed within the dielectric layer 120. The conductive layer 131 may include conductive materials, such as aluminum (Al), copper (Cu), tungsten (W), titanium (Ti), tantalum (Ta), or other applicable materials.

In some embodiments, the semiconductor device 100a may include a pattern 132a. In some embodiments, the pattern 132a may be disposed on or over the region 110b of the substrate 110. In some embodiments, the pattern 132a may be located at a horizontal level H1. In some embodiments, the pattern 132a may be configured to serve as a part of an overlay mark structure (e.g., 160a). The pattern 132a may be disposed within the dielectric layer 120. The pattern 132a may include conductive materials, such as Al, Cu, W, Ti, Ta, or other applicable materials.

In some embodiments, the semiconductor device 100a may include a dielectric layer 140. The dielectric layer 140 may be disposed on or over the region 110a of the substrate 110. The dielectric layer 140 may be disposed on or over the region 110b of the substrate 110. The dielectric layer 140 may cover the substrate 110. In some embodiments, the dielectric layer 140 may cover a portion of the conductive layer 131. The dielectric layer 140 may include one or more layers made of insulating material, such as silicon oxide or silicon nitride.

In some embodiments, the semiconductor device 100a may include a feature 151. In some embodiments, the feature 151 may be disposed on or over the region 110a of the substrate 110. In some embodiments, the feature 151 may be located at a horizontal level H2 higher than the horizontal level H1. In some embodiments, the feature 151 may be an opening, a hole, or a trench. In some embodiments, the feature 151 may be configured to accommodate a conductive contact. In some embodiments, the feature 151 may expose a portion of the conductive layer 131. In some embodiments, the feature 151 may penetrate the dielectric layer 140.

In some embodiments, the semiconductor device 100a may include a pattern 152a. In some embodiments, the pattern 152a may be disposed on or over the region 110b of the substrate 110. In some embodiments, the pattern 152a may be located at a horizontal level H2. In some embodiments, the pattern 152a may be located at a horizontal level H2 the same as that of the feature 151. In some embodiments, the pattern 152a may have a dimension, such as a width, a length, a radius, or a surface area, different from that of the feature 151. In some embodiments, the pattern 152a may have a profile different from that of the feature 151. In some embodiments, the pattern 152a may be an opening, a hole, or a trench. In some embodiments, the pattern 152a may expose a portion of the pattern 132a. In some embodiments, the pattern 152a may penetrate the dielectric layer 140. In some embodiments, the pattern 152a may be configured to serve as a part of an overlay mark structure (e.g., 160a).

In some embodiments, the semiconductor device 100a may include an overlay mark structure 160a. In some embodiments, the overlay mark structure 160a may be disposed on or over the region 110b of the substrate 110. In some embodiments, the overlay mark structure 160a may include the pattern 132a and the pattern 152a. In some embodiments, the pattern 132a may serve as a pre-layer (or a lower layer) of the overlay mark structure 160a. In some embodiments, the pattern 152a and/or the dielectric layer 140 may serve as a current layer (or an upper layer) of the overlay mark structure 160a.

In some embodiments, the overlay mark structure 160a may be utilized to measure whether the current layer, such as an opening of a dielectric layer, is precisely aligned with a pre-layer, such as the M0 layer, M1 layer, or the like, in the semiconductor fabrication process. In some embodiments, the overlay mark structure 160a may be utilized to generate an overlay error between a current layer (e.g., pattern 152a) and a pre-layer (or pattern 132a).

Figure 4:
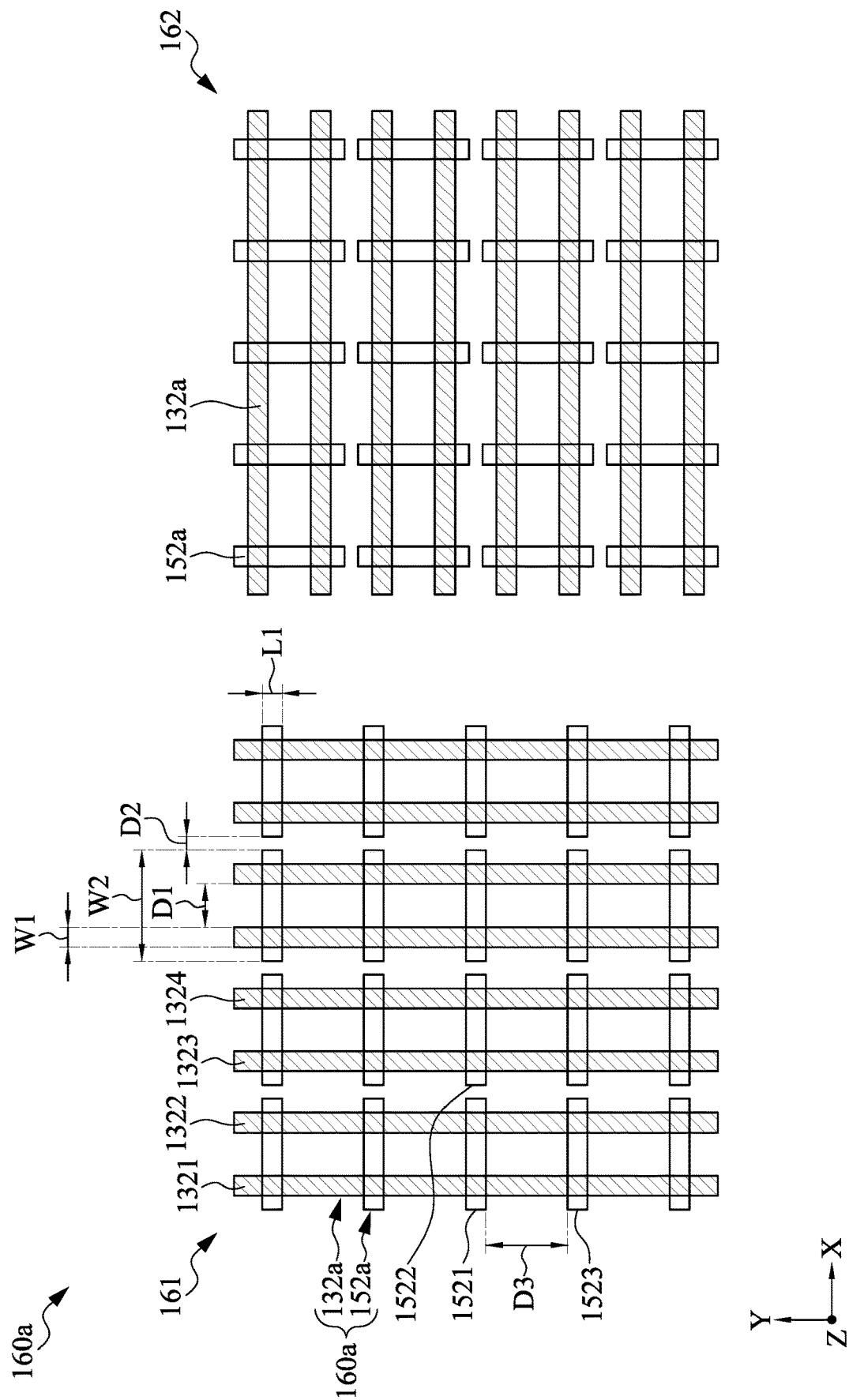
FIG. 4 is a top view of a mark for measuring an overlay, in accordance with some embodiments of the present disclosure.

FIG. 4 is a top view of the overlay mark structure 160a, in accordance with some embodiments of the present disclosure.

In some embodiments, the overlay mark structure 160a may include a structure portion 161 and a structure portion 162. Each of the structure portions 161 and 162 may be located in one of two quadrature targets areas. In some embodiments, the structure portion 161 may be utilized to measure an overlay error of the X direction. In some embodiments, the structure portion 162 may be utilized to measure an overlay error of the Y direction. In other embodiments, the overlay mark structure 160a may include four structure portions. In other embodiments, the overlay mark structure 160a may include one structure portion, which may be utilized to measure an overlay error of the X direction and the Y direction.

In some embodiments, each of the structure portions 161 and 162 may include the pattern 132a and the pattern 152a. In some embodiments, the pattern 132a of the structure portion 161 may extend along the Y direction. In some embodiments, the pattern 152a of the structure portion 161 may extend along the X direction. In some embodiments, the pattern 132a of the structure portion 162 may extend along the X direction. In some embodiments, the pattern 152a of the structure portion 162 may extend along the Y direction.

While measuring an overlay error using an overlay mark structure, such as the overlay mark structure 160a, an X-directional deviation is measured along a straight line in an X direction of the overlay mark structure 160a. A Y-directional deviation is further measured along a straight line in a Y direction of the overlay mark structure 160a. Each of the structure portions 161 and 162 may be used to measure one X- and one Y-directional deviation between two layers on a substrate. Therefore, whether the current layer and the pre-layer are precisely aligned can be determined according to the X- and Y-directional deviations. The overlay error may include the X-directional deviation (ΔX), the Y-directional deviation (ΔY), or a combination of both.

The pattern 132a may include metallization layers 1321, 1322, 1323, and 1324. The metallization layers 1321, 1322, 1323, and 1324 may be spaced apart from each other. Each of the metallization layers 1321, 1322, 1323, and 1324 may extend along the Y direction. Each of the metallization layers 1321, 1322, 1323, and 1324 may be a segment of the pattern 132a.

The pattern 152a may include holes 1521, 1522, and 1523. The holes 1521, 1522, and 1523 may be spaced apart from each other. Each of the holes 1521, 1522, and 1523 may extend along the X direction. The hole 1521 may be aligned with the hole 1522 along the X direction. The hole 1521 may be aligned with the hole 1523 along the Y direction. Each of the holes 1521, 1522, and 1523 may be a part of the pattern 152a.

In some embodiments, the hole 1521 may overlap the metallization layer 1321 and the metallization layer 1322 along the Z direction. In some embodiments, the hole 1522 may overlap the metallization layer 1323 and the metallization layer 1324 along the Z direction. In some embodiments, the hole 1523 may overlap the metallization layer 1321 and the metallization layer 1322 along the Z direction.

Each of the metallization layers 1321, 1322, 1323, and 1324 may have a dimension W1 along, for example, the X direction. Each of the hole 1521, hole 1522, and hole 1523 may have a dimension W2 along, for example, the X direction. Each of the holes 1521, 1522, and 1523 may have a dimension L1 along, for example, the Y direction. The metallization layer 1321 and the metallization layer 1322 may have a distance D1 along, for example, the X direction, therebetween. The hole 1521 and the hole 1522 may have a distance D2 along, for example, the X direction, therebetween. The hole 1521 and hole 1523 may have a distance D3 along, for example, the Y direction, therebetween.

In some embodiments, the dimension W2 of the hole 1521 may be greater than the dimension W1 of the metallization layer 1321. In some embodiments, the dimension W2 of the hole 1521 may be greater than the distance D1. In some embodiments, the dimension W2 of the hole 1521 may be greater than the dimension L1 of the hole 1521. In some embodiments, the dimension W2 of the hole 1521 may be greater than the distance D2. In some embodiments, the dimension L1 of the hole 1521 may be greater than the distance D1.

In a comparative example, an overlay mark structure of an image-based overlay (IBO) measurement is utilized to measure an overlay error between, for example, the M0 layer and the conductive contact (which may also be referred to as "C0 layer") over the M0 layer. The overlay mark structure used in the IBO measurement includes the metallization layers of the pre-layer and openings defined by a photoresist layer of the current layer. In some situations, the overlay errors, for example, between the M0 layer and the C0 layer generated by the IBO measurement may have a systematic error, which cannot present the real overlay error. In this embodiment, a new overlay mark structure includes the metallization layers as the pre-layer and openings, defined by a dielectric layer, as the current layer. Such overlay structure may be free of systematic error when measuring an overlay error between the M0 layer and the C0 layer. The current layer may have a plurality of parts, each of which may extend across two or more pre-layers. Such structure may assist in generating an overlay error more accurately.

Figure 5:
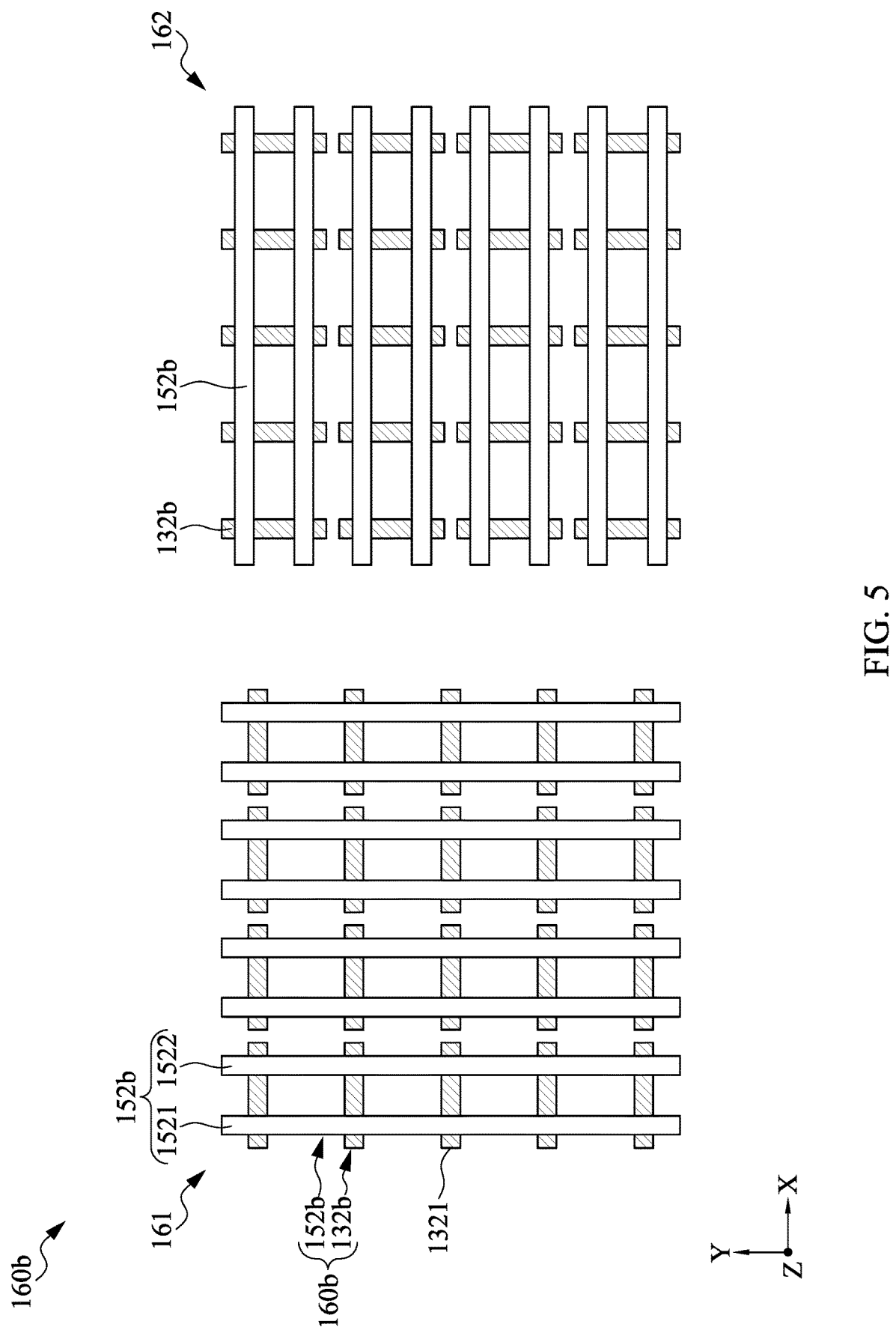
FIG. 5 is a top view of a mark for measuring an overlay, in accordance with some embodiments of the present disclosure.

FIG. 5 is a top view of the overlay mark structure 160b, in accordance with some embodiments of the present disclosure.

In some embodiments, the overlay mark structure 160b may include a pattern 132b and a pattern 152b over the pattern 132b. In some embodiments, the pattern 132b may be located at a horizontal level the same that of the M0 layer. In some embodiments, the pattern 152b may be located at a horizontal level the same that of the C0 layer.

The overlay mark structure 160b may include the structure portion 161 and the structure portion 162. In some embodiments, the pattern 132b of the structure portion 161 may extend along the X direction. In some embodiments, the pattern 152b of the structure portion 161 may extend along the Y direction. In some embodiments, the pattern 132b of the structure portion 162 may extend along the Y direction. In some embodiments, the pattern 152b of the structure portion 162 may extend along the X direction.

The pattern 132b may include the metallization layer 1321.

The pattern 152b may include holes 1521 and 1522 spaced apart from the hole 1521.

In some embodiments, the metallization layer 1321 may overlap the holes 1521 and 1522 along the Z direction.

In this embodiment, a new overlay mark structure includes the metallization layers of the pre-layer and openings defined by a dielectric layer of the current layer. Such overlay structure may be free of systematic error when measuring an overlay error between the M0 layer and the C0 layer. The pre-layer may have a plurality of portions, each of which may extend across two or more current layers. Such structure may assist in generating an overlay error more accurately.

Figure 6:
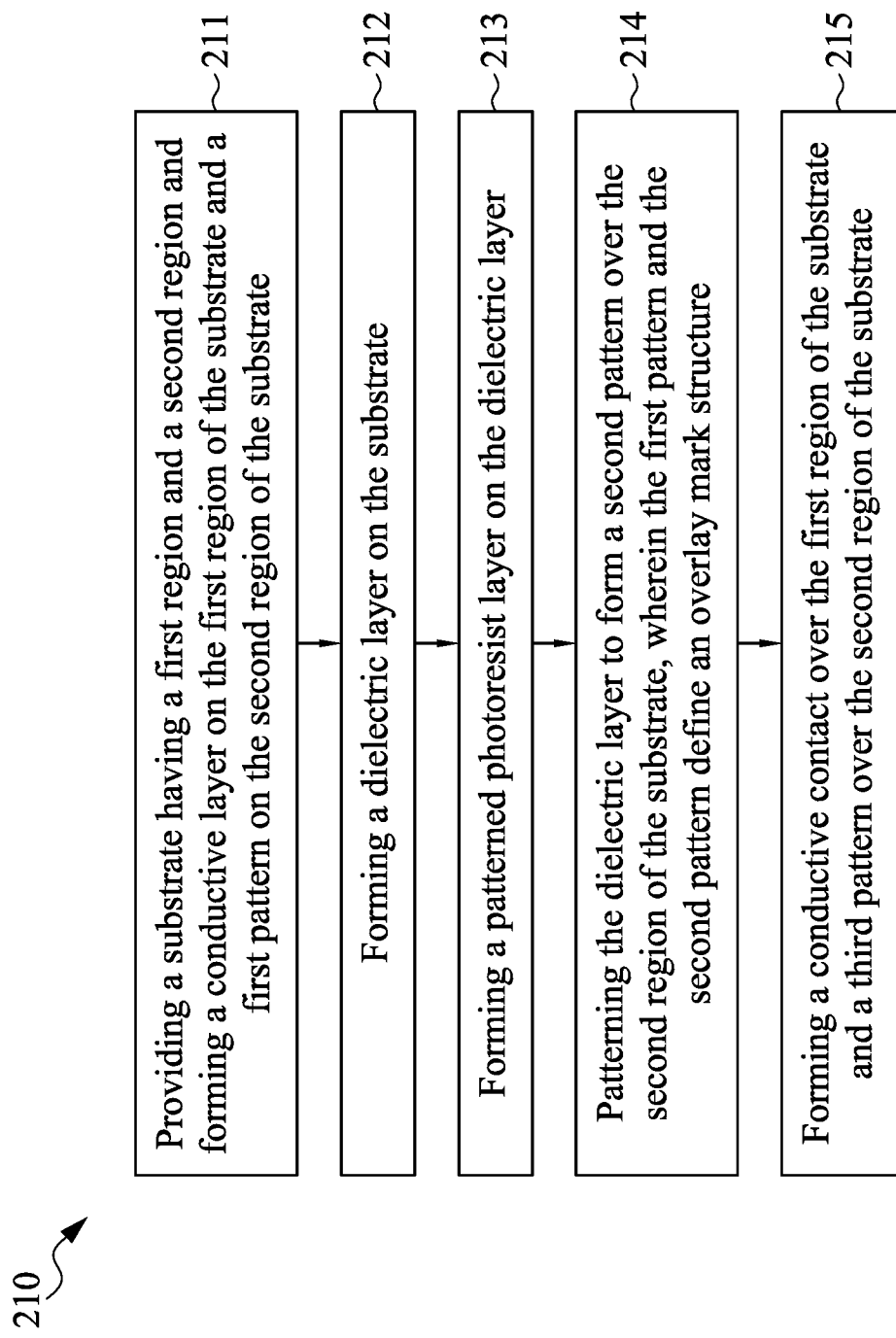
FIG. 6 is a flowchart illustrating a method for manufacturing a semiconductor device, in accordance with various aspects of the present disclosure.

FIG. 6 is a flowchart illustrating a method 210 for manufacturing a semiconductor device, in accordance with various aspects of the present disclosure.

The method 210 begins with operation 211 in which a substrate may be provided. In some embodiments, the substrate may include a first region and a second region. The first region of the substrate may be configured to form ICs thereon. The second region of the substrate may be configured to form an overlay mark structure thereon. A first dielectric layer may be formed on the substrate. A conductive layer may be formed on the first region of the substrate. A first pattern may be formed on the second region of the substrate. In some embodiments, the first dielectric layer may be patterned to form a plurality of openings. The conductive layer and the first pattern may fill the opening defined by the substrate.

The method 210 continues with operation 212 in which a second dielectric layer may be formed on the substrate. The second dielectric layer may cover the conductive layer. The second dielectric layer may cover the first pattern.

The method 210 continues with operation 213 a patterned photoresist layer may be formed on the second dielectric layer.

The method 210 continues with operation 214 the second dielectric layer may be patterned. A hole and a second pattern may be formed. In some embodiments, the hole may be formed on the first region of the substrate. In some embodiments, the second pattern may be formed on the second region of the substrate. In some embodiments, the hole may be located at a horizontal level the same as that of the second pattern. In some embodiments, the hole may have a dimension, such as a width, a length, a radius, or a surface area, different from that of the second pattern. In some embodiments, the hole may have a profile different from that of the second pattern. In some embodiments, the second pattern may be an opening, a hole, or a trench.

The first pattern and the second pattern may collectively serve as an overlay mark structure. The first pattern and the second pattern are associated with an overlay error. The first pattern and the second pattern may be collectively configured to define an overlay error. If the overlay error exceeds a predetermined value, the process conditions of the fabrication equipment, such as an exposure equipment, may be tuned.

The method 210 continues with operation 215 a conductive contact and a third pattern may be formed. In some embodiments, the conductive contact may fill the hole. In some embodiments, the conductive contact may be formed on the first region of the substrate. In some embodiments, the third pattern may fill the second pattern. In some embodiments, the third pattern may be formed on the second region of the substrate. In some embodiments, the conductive contact may be located at a horizontal level the same as that of the third pattern.

The method 210 is merely an example, and is not intended to limit the present disclosure beyond what is explicitly recited in the claims. Additional operations can be provided before, during, or after each operation of the method 210, and some operations described can be replaced, eliminated, or reordered for additional embodiments of the method. In some embodiments, the method 210 can include further operations not depicted in FIG. 6. In some embodiments, the method 210 can include one or more operations depicted in FIG. 6.

FIG. 7A, FIG. 7B, FIG. 7C, FIG. 7D, and FIG. 7E illustrates one or more stages of an exemplary method for manufacturing a semiconductor device 100b according to some embodiments of the present disclosure.

Figure 7A:
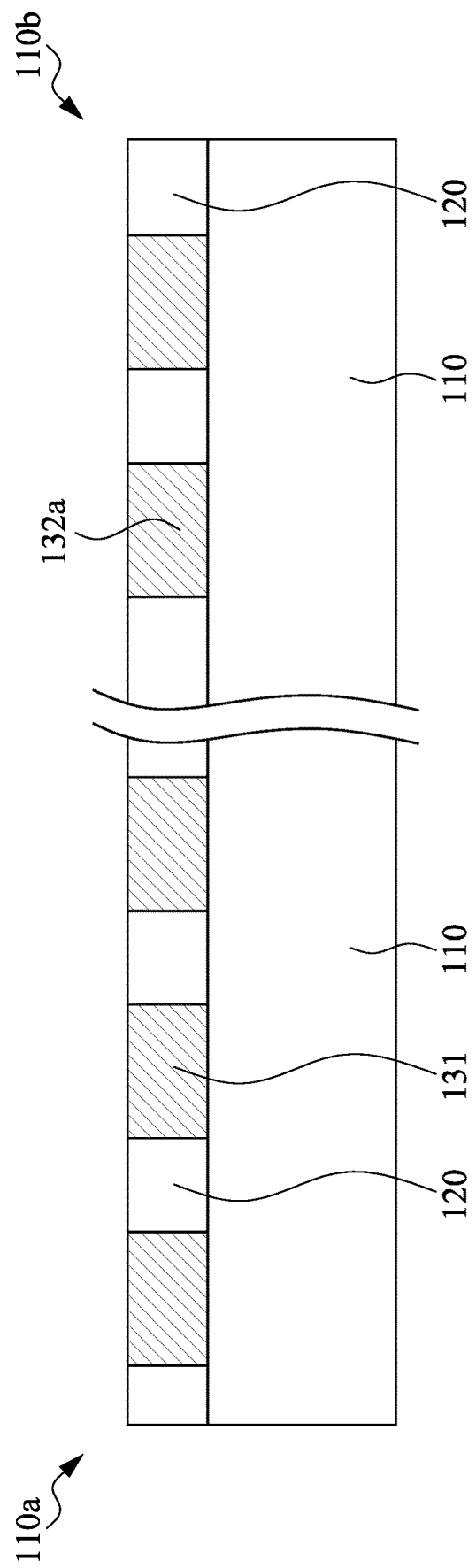
FIG. 7A illustrates one or more stages of an exemplary method for manufacturing a semiconductor device according to some embodiments of the present disclosure.

Referring to FIG. 7A, a substrate 110 may be provided. In some embodiments, the substrate 110 may include a region 110a and a region 110b. The region 110a of the substrate 110 may be configured to form ICs thereon. The region 110b of the region 110b may be configured to form an overlay mark structure thereon.

A dielectric layer 120 may be formed on the substrate 110. The dielectric layer 120 may be formed by chemical vapor deposition (CVD), atomic layer deposition (ALD), physical vapor deposition (PVD), low-pressure chemical vapor deposition (LPCVD) and plasma-enhanced CVD (PECVD), or other suitable processes.

A conductive layer 131 may be formed on the region 110a of the substrate 110. A pattern 132a may be formed on the region 110b of the substrate 110. In some embodiments, the dielectric layer 120 may be patterned to form a plurality of openings. The conductive layer 131 and the pattern 132a may fill the opening defined by the dielectric layer 120. The conductive layer 131 and the pattern 132a may be formed by PVD, CVD, ALD, LPCVD, PECVD, or other suitable processes.

Figure 7B:
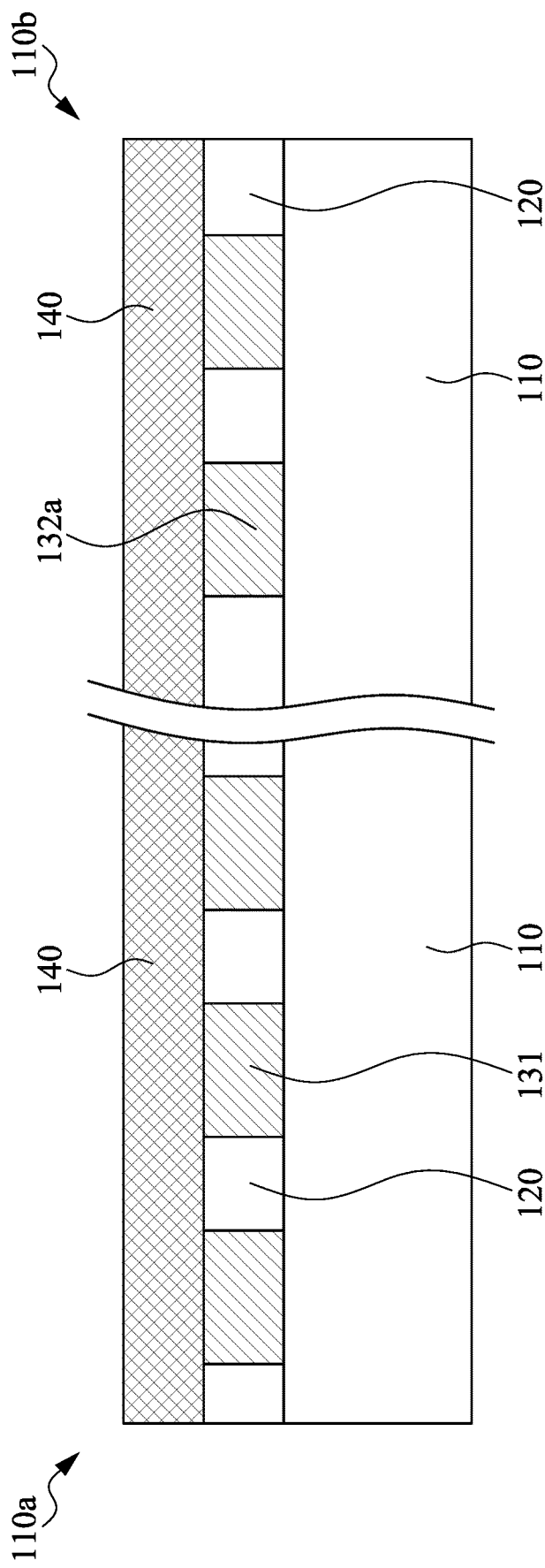
FIG. 7B illustrates one or more stages of an exemplary method for manufacturing a semiconductor device according to some embodiments of the present disclosure.

Referring to FIG. 7B, a dielectric layer 140 may be formed on the substrate 110. The dielectric layer 140 may cover the conductive layer 131. The dielectric layer 140 may cover the pattern 132a. The dielectric layer 140 may be formed by CVD, ALD, LPCVD, PECVD, PVD, or other suitable processes.

Figure 7C:
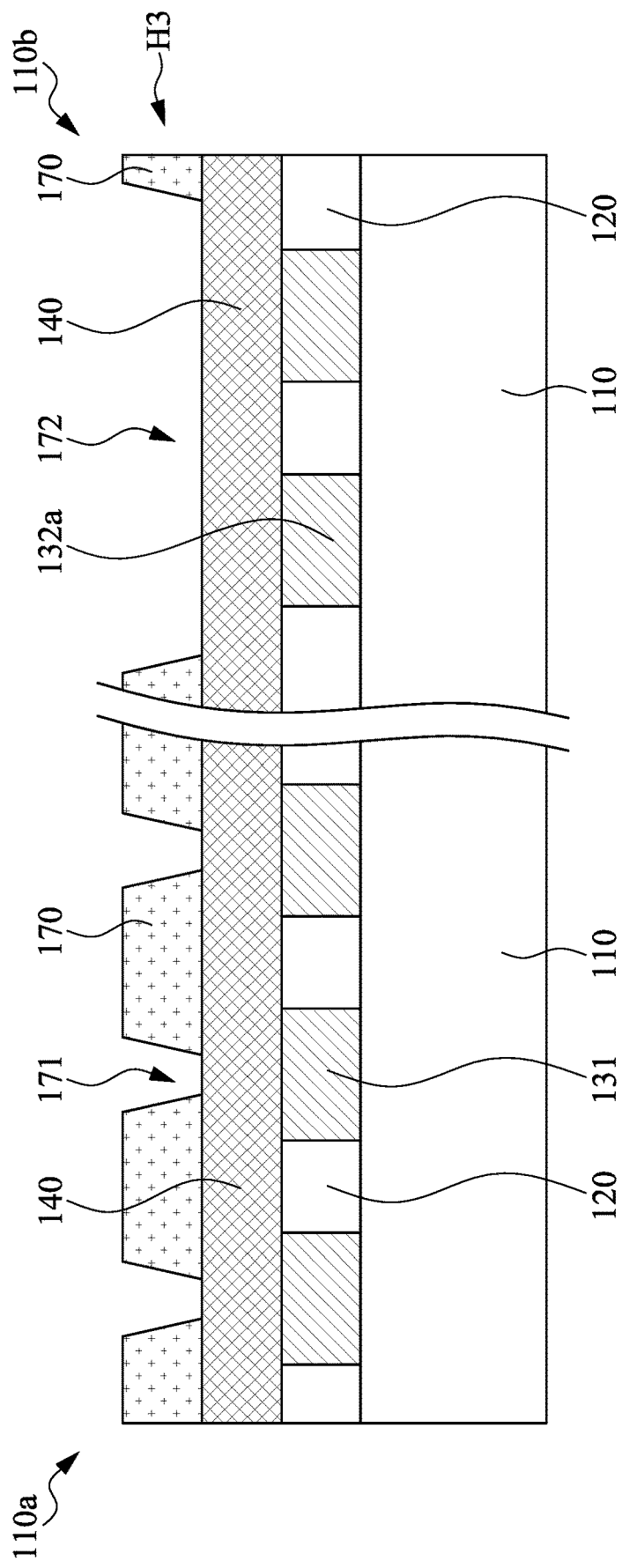
FIG. 7C illustrates one or more stages of an exemplary method for manufacturing a semiconductor device according to some embodiments of the present disclosure.

Referring to FIG. 7C, a patterned photoresist layer 170 may be formed on the dielectric layer 140. The patterned photoresist layer 170 may include a positive-tone or negative-tone photoresist, such as polymer, or a hard mask such as silicon nitride or silicon oxy-nitride. In some embodiments, the patterned photoresist layer 170 may define a pattern 171 on the region 110a of the substrate 110 and a pattern 172 on the region 110b of the substrate 110.

In some embodiments, the pattern 171 may be located at a horizontal level H3 the same as that of the pattern 172. In some embodiments, the pattern 171 may have a dimension, such as a width, a length, a radius, or a surface area, different from that of the pattern 172. In some embodiments, the pattern 171 may have a profile different from that of the pattern 172. In some embodiments, each of the pattern 171 and the pattern 172 may be an opening, a hole, or a trench. In some embodiments, the pattern 171 and the pattern 172 may expose a portion of the dielectric layer 140. In some embodiments, the pattern 171 and the pattern 172 may penetrate the patterned photoresist layer 170.

Figure 7D:
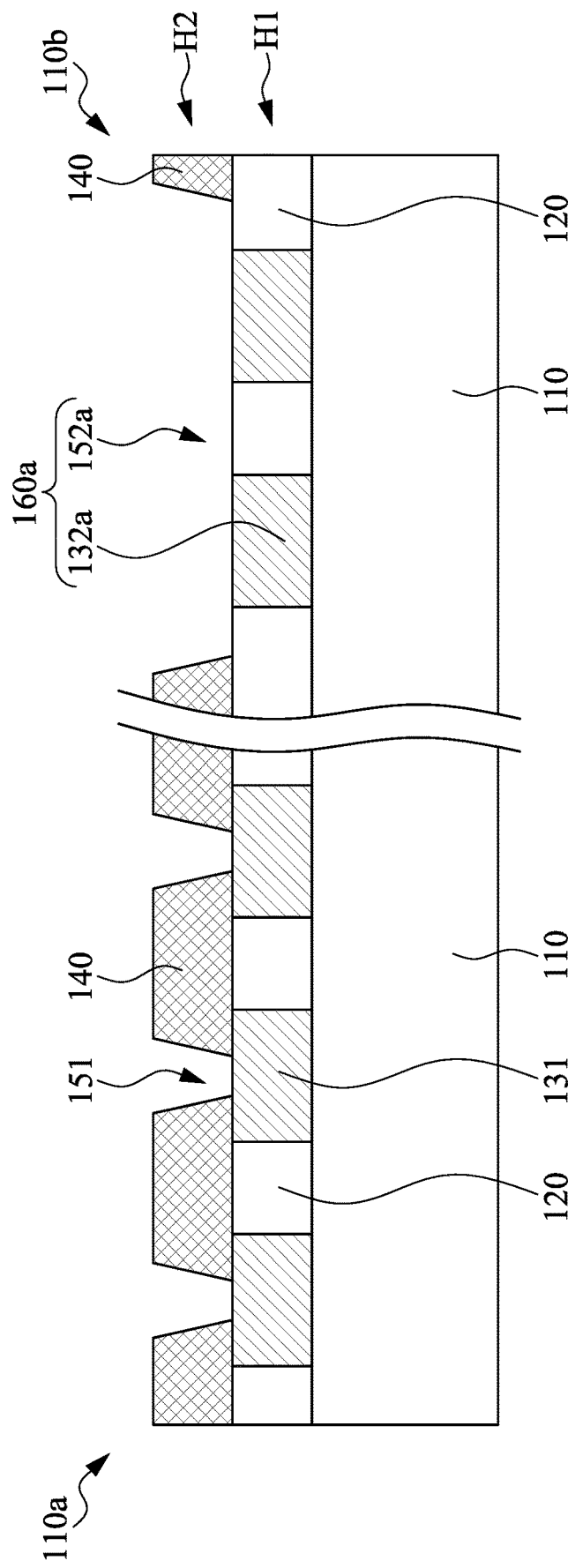
FIG. 7D illustrates one or more stages of an exemplary method for manufacturing a semiconductor device according to some embodiments of the present disclosure.

Referring to FIG. 7D, the dielectric layer 140 may be patterned. A feature 151 and a pattern 152a may be formed. In some embodiments, the feature 151 may be formed on the region 110a of the substrate 110. In some embodiments, the pattern 152a may be formed on the region 110b of the substrate 110. In some embodiments, the feature 151 may be located at a horizontal level H2 the same as that of the pattern 152a. In some embodiments, the feature 151 may have a dimension, such as a width, a length, a radius, or a surface area, different from that of the pattern 152a. In some embodiments, the feature 151 may have a profile different from that of the pattern 152a. In some embodiments, each of the feature 151 and the pattern 152a may be an opening, a hole, or a trench.

The pattern 132a and the pattern 152a may collectively define an overlay mark structure 160a. The pattern 132a and the pattern 152a may be collectively configured to define an overlay error. If the overlay error exceeds a predetermined value, the process conditions of the fabrication equipment, such as an exposure equipment, may be tuned.

Figure 7E:
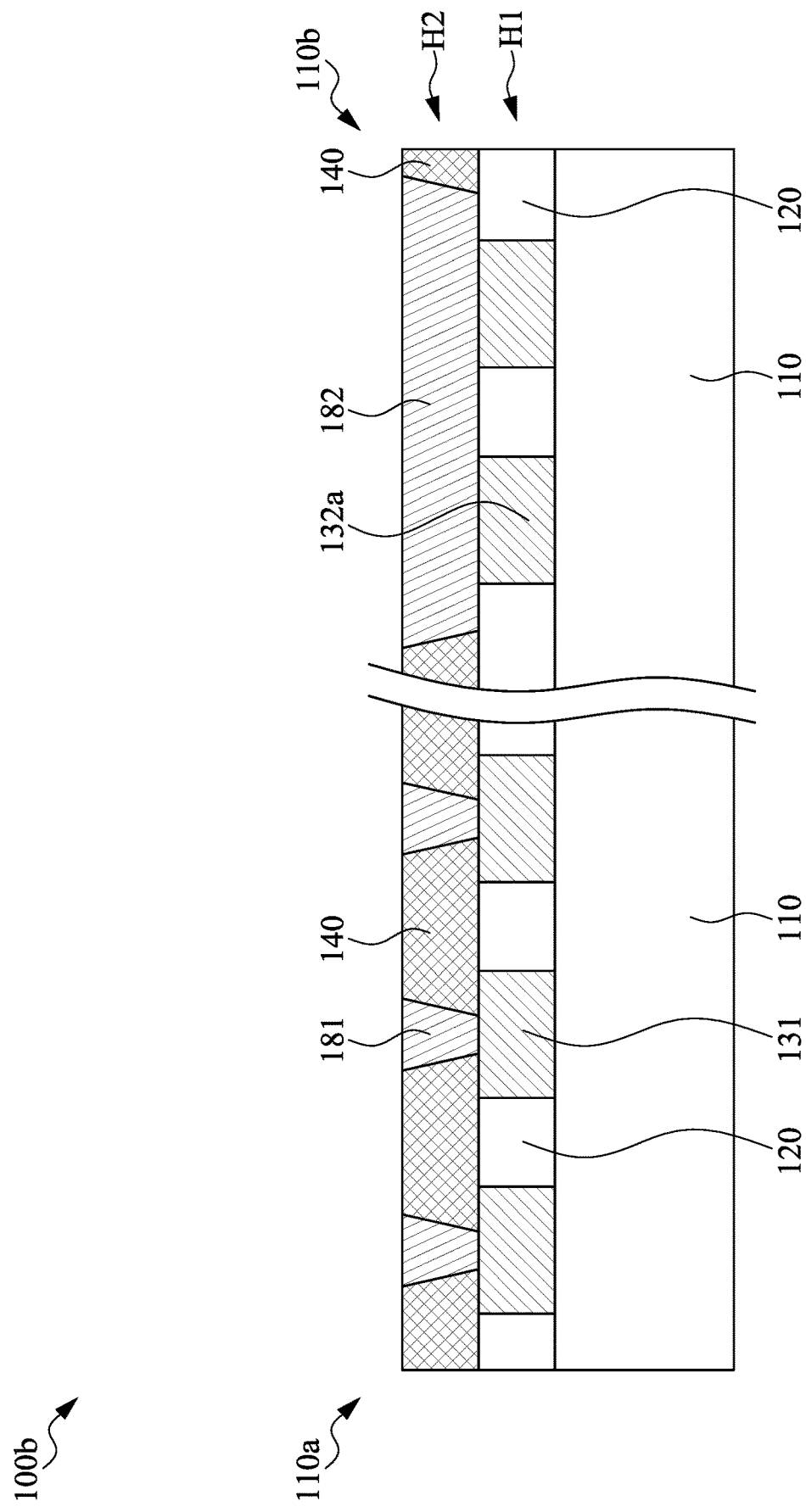
FIG. 7E illustrates one or more stages of an exemplary method for manufacturing a semiconductor device according to some embodiments of the present disclosure.

Referring to FIG. 7E, a conductive feature 181 and a pattern 182 may be formed. As a result, the semiconductor device 100b may be produced. In some embodiments, the conductive feature 181 may fill the feature 151. In some embodiments, the conductive feature 181 may be formed on the region 110a of the substrate 110. In some embodiments, the pattern 182 may fill the pattern 152a. In some embodiments, the pattern 182 may be formed on the region 110b of the substrate 110. In some embodiments, the conductive feature 181 may be located at a horizontal level H2 the same as that of the pattern 182. In some embodiments, the pattern 182 may be in contact with the pattern 132a.

Figure 8:
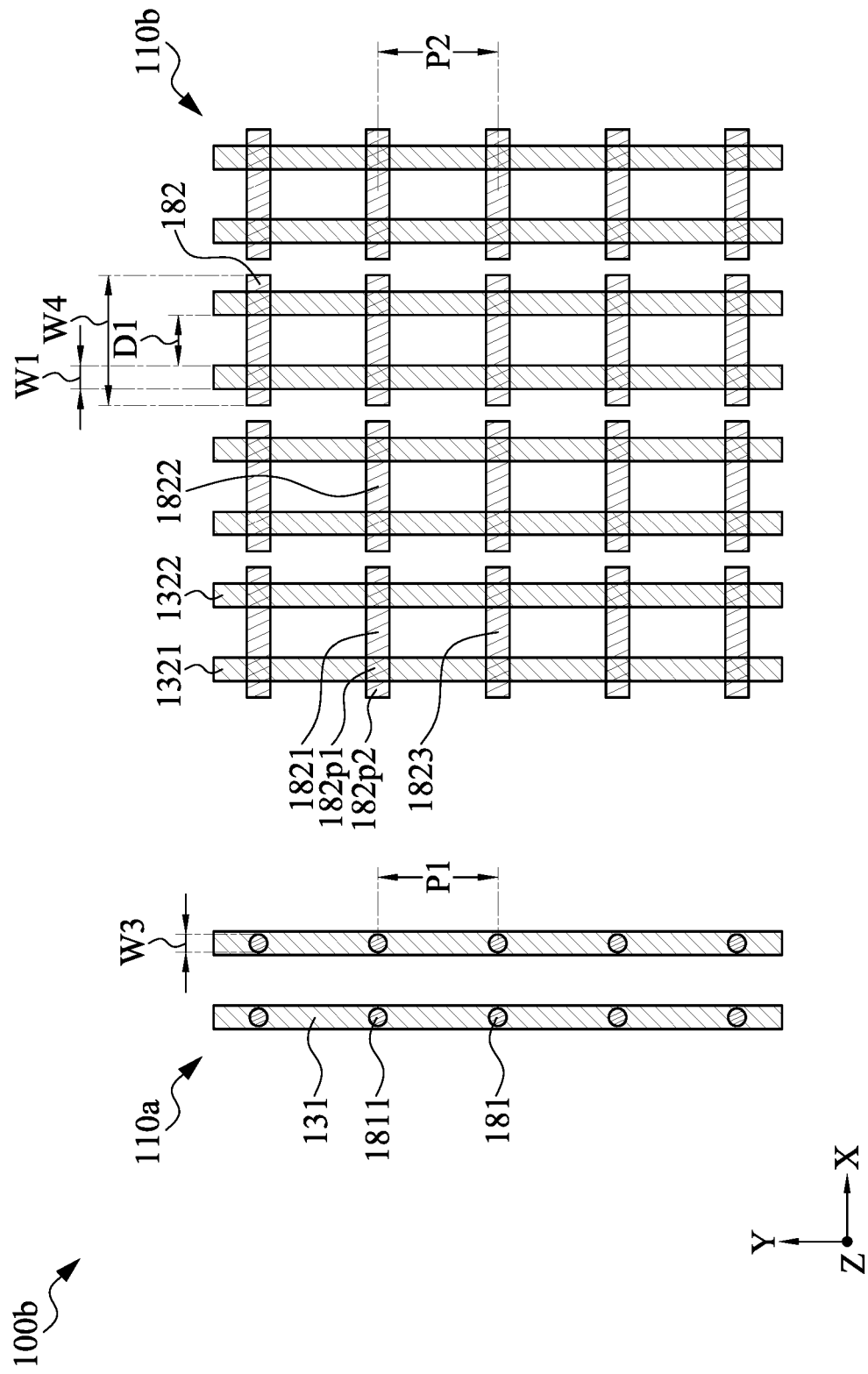
FIG. 8 is a top view corresponding to the structure as shown in FIG. 7E, in accordance with some embodiments of the present disclosure.

FIG. 8 is a top view corresponding to the structure as shown in FIG. 7E, in accordance with some embodiments of the present disclosure.

In some embodiments, the conductive feature 181 may include a plurality of conductive contacts 1811 separated from each other.

In some embodiments, the pattern 182 may include a metallization layer 1821, a metallization layer 1822, and a metallization layer 1823. The metallization layer 1821 may be aligned with the metallization layer 1822 along the X direction. In some embodiments, the metallization layer 1821 may be aligned with the conductive contact 1811 along the X direction. The metallization layer 1821 may be aligned with the metallization layer 1823 along the Y direction. In some embodiments, the metallization layer 1823 may be aligned with the conductive contact 1811 along the X direction. In some embodiments, the metallization layer 1821 may overlap the metallization layer 1321 and the metallization layer 1322 along the Z direction.

The conductive contact 1811 may have a dimension W3. Each of the metallization layer 1821, metallization layer 1822, and metallization layer 1823 may have a dimension W4 along the X direction. The plurality of conductive contacts 1811 may have a pitch P1 along the Y direction. The pattern 182 may have a pitch P2 along the Y direction.

In some embodiments, the conductive feature 181 may have a dimension different from that of the pattern 182. In some embodiments, the conductive feature 181 may have a profile different from that of the pattern 182. In some embodiments, the conductive contact 1811 may have a dimension different from that of the metallization layer 1821. In some embodiments, the conductive contact 1811 may have a profile different from that of the metallization layer 1821.

In some embodiments, the dimension W3 may be less than the dimension W1. In some embodiments, the dimension W3 may be less than the dimension W4. In some embodiments, the dimension W3 may be less than the distance D1. In some embodiments, the pitch P1 may be substantially the same as the pitch P2.

In some embodiments, each of the metallization layers 1821, 1822, and 1823 may have a portion 182$pi$ overlapping the metallization layer 1321 or 1322 along the Z direction. In some embodiments, each of the metallization layers 1821, 1822, and 1823 may have a portion 182$p2$ free from overlapping the metallization layer 1321 or 1322 along the Z direction.

Figure 9:
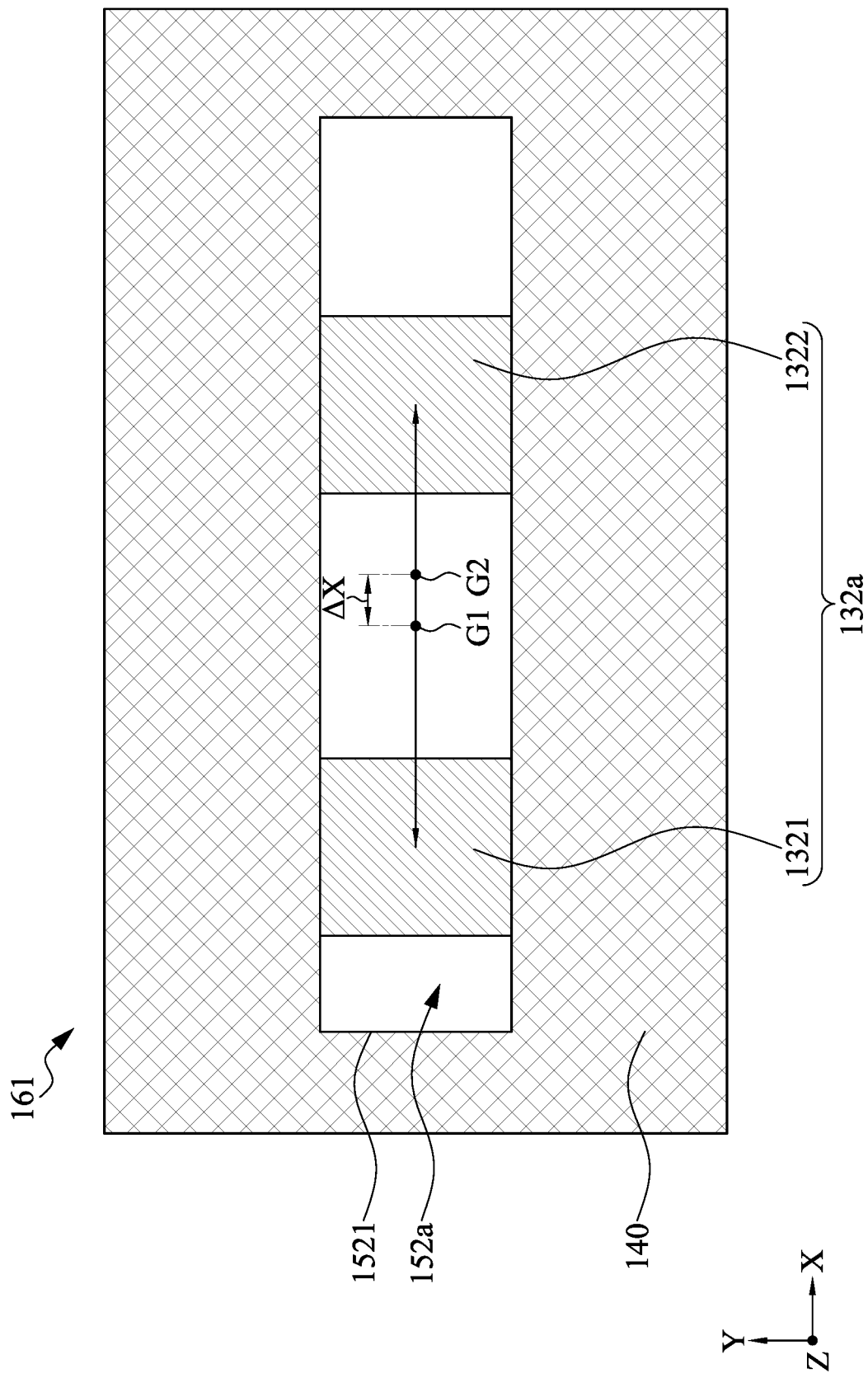
FIG. 9 is a top view of a part of a mark for measuring overlay, in accordance with some embodiments of the present disclosure.

FIG. 9 is an enlarged view of the structure portion 161 of an overlay mark structure (e.g., 160$a$), in accordance with some embodiments of the present disclosure.

The metallization layer 1321 and the metallization layer 1322 may have a geometric center (e.g., gravity center) G1 therebetween. The hole 1521 may have a geometric center (e.g., gravity center) G2 therein. In some embodiments, an X-directional deviation ΔX may be determined based on the geometric centers G1 and G2. Similarly, a Y-directional deviation ΔY may be determined based on the geometric centers of the structure portion 162 (not shown in FIG. 9). In some embodiments, an overlay error may be determined based on the X-directional deviation ΔX and the Y-directional deviation ΔY.

Figure 10:
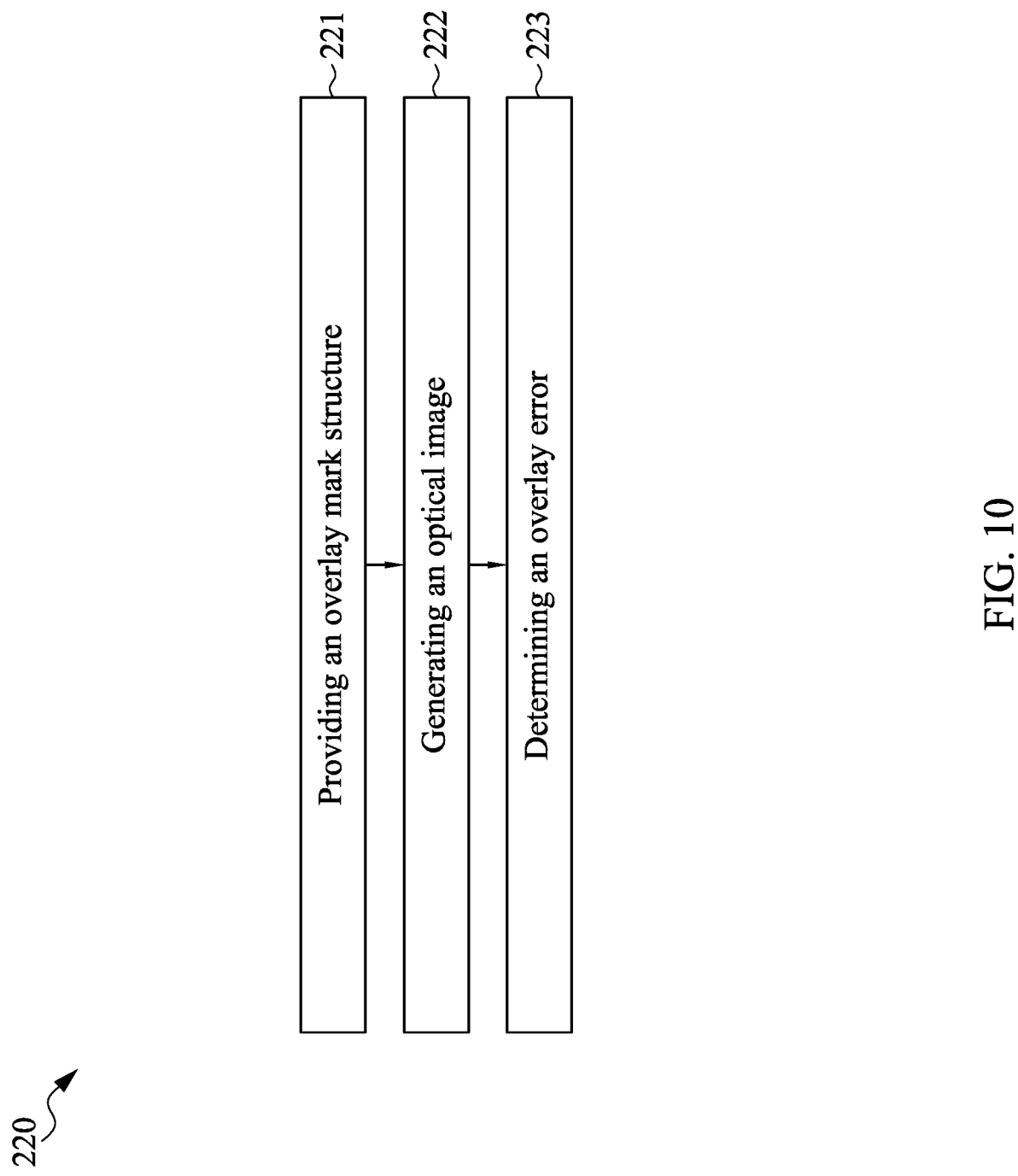
FIG. 10 is a flowchart illustrating a method for manufacturing a semiconductor device, in accordance with various aspects of the present disclosure.

FIG. 10 is a flowchart illustrating a method 220 for measuring an overlay error, in accordance with various aspects of the present disclosure.

The method 220 begins with operation 221 in which an over layer structure may be provided. The overlay structure may include a first pattern and a second pattern over the first pattern.

In some embodiments, the first pattern may be located at a horizontal level the same as that of the M0 layer, M1 layer, M2 layer, and so on. The second pattern may be located at a horizontal level the same as that of a conductive contact formed over the M0 layer, M1 layer, M2 layer, and so on. The second pattern may be a hole defined by a dielectric layer which is formed over the first pattern. In some embodiments, the hole may extend across two or more metallization layers of the first pattern.

The method 220 continues with operation 222 in which an optical image is generated. The optical image may include at least a hole of the second pattern as well as a first metallization layer and a second metallization layer of the first pattern.

The method 220 continues with operation 223 in which an overlay error may be determined. A first geometric center of the first pattern may and a second geometric center of the second pattern may be determined based on the optical image. The overlay error may be determined by the first geometric center and the second geometric center.

The method 220 is merely an example, and is not intended to limit the present disclosure beyond what is explicitly recited in the claims. Additional operations can be provided before, during, or after each operation of the method 220, and some operations described can be replaced, eliminated, or reordered for additional embodiments of the method. In some embodiments, the method 220 can include further operations not depicted in FIG. 10. In some embodiments, the method 220 can include one or more operations depicted in FIG. 10.

Figure 11:
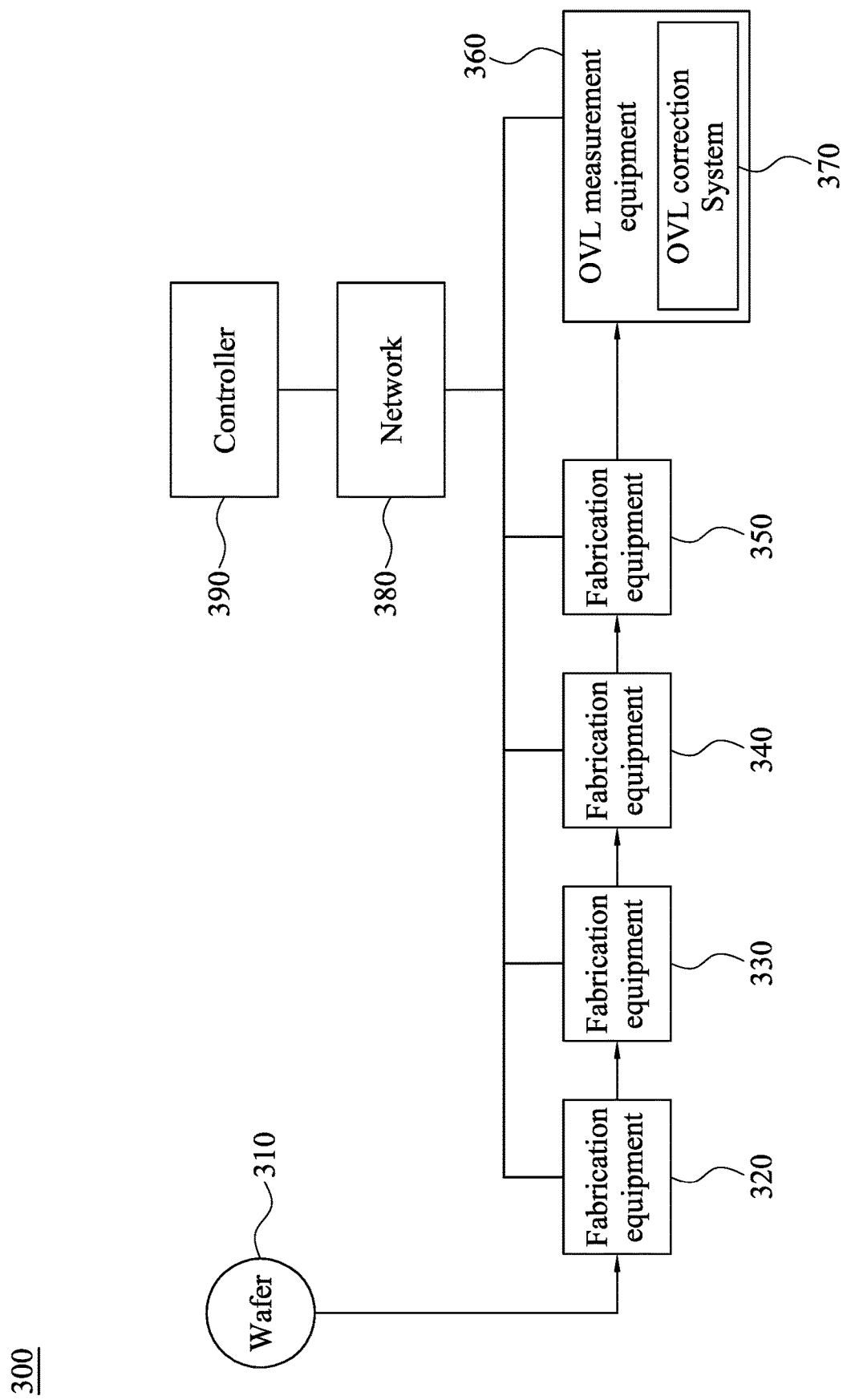
FIG. 11 is a block diagram illustrating a semiconductor fabrication system, in accordance with some embodiments of the present disclosure.

FIG. 11 is a block diagram illustrating a semiconductor fabrication system 300, in accordance with some embodiments of the present disclosure.

The semiconductor fabrication system 300 may include fabrication equipment 320, 330, 340, 350, as well as overlay measurement equipment 360. An overlay correction system 370 may be included or built in the overlay measurement equipment 360. The fabrication equipment 320, 330, 340, 350, as well as overlay measurement equipment 360 may be signally coupled with a controller 390 through a network 380. In some embodiments, the overlay correction system 370 may be an independent system signally coupled to the overlay measurement equipment 360 through the network 380. Each of the fabrication equipment 320, 330, 340, 350 may include a plurality of fabrication tools, which may be configured to perform one or more processes.

The fabrication equipment 320 may be used to form elements or features, such as the pre-layer (e.g., the pattern 132$a$) and the M0 layer. The fabrication equipment 320 may be used to perform a deposition process, an etching process, a chemical mechanical polishing process, photoresist coating process, baking process, an alignment process, or other processes.

The fabrication equipment 330 may be used to form a dielectric layer (e.g., the dielectric layer 140). The fabrication equipment 320 may be used to perform a deposition process, an etching process, a chemical mechanical polishing process, photoresist coating process, baking process, an alignment process, or other processes.

The fabrication equipment 340 may be used to form a patterned photoresist layer, such as the patterned photoresist layer 170 shown in FIG. 7C. The fabrication equipment 340 may be configured to perform, for example, exposure, exposure process, developing process, and/or other suitable processes.

The fabrication equipment 350 may be used to form a current layer, such as the pattern 152$a$ shown in FIG. 7D. The fabrication equipment 350 may be configured to perform, for example, an etching process and/or other suitable processes.

In some embodiments, the overlay measurement equipment 360 may be used to obtain optical images of the pre-layer and the current layer, and to generate an overlay error based on the optical images of the overlay mark structure 160a or 160b.

The overlay correction system 370 may include correction parameters used to generate an overlay error. The overlay correction system 370 may include, for example, a calculator or a server. In some embodiments, the corrected overlay error may be generated or calculated by program codes or program languages. For example, the corrected overlay error may be determined by the overlay error obtained from the overlay measurement equipment 360 and the correction parameters of the overlay correction system 370. In some embodiments, an X-directional deviation ($\Delta X$), Y-directional deviation ($\Delta Y$), or the combination of both, may be generated from the correction parameters. Each of the X-directional deviation ($\Delta X$), the Y-directional deviation ($\Delta Y$), or the combination of both may be represented by equation(s) involving the correction parameters as variables.

The network 380 can be the internet or an intranet implementing network protocols such as transmission control protocol (TCP). Through the network 380, each piece of fabrication equipment 320, 330, 340, 350, as well as overlay measurement equipment 360 may download or upload work in progress (WIP) information regarding to the wafer or the fabrication equipment from or to the controller 390.

The controller 390 can include a processer, such as a central processing unit (CPU). In some embodiments, the controller 390 may be utilized to generate an instruction whether to adjust the fabrication equipment 350 based on the overlay error. In some embodiments, in response to an overlay error exceeding a predetermined value, the controller 390 may generate an instruction to adjust process conditions of the fabrication equipment 350.

Although FIG. 11 does not show any other fabrication equipment before the fabrication equipment 320, the exemplary embodiment is not intended to be limiting. In other exemplary embodiments, various kinds of fabrication equipment can be scheduled before the fabrication equipment 320, and can be used to perform various processes according to the design requirement.

In the exemplary embodiments, a wafer 310 is transferred to the fabrication equipment 320 to start a sequence of different processes. The wafer 310 may be processed by various stages forming at least one layer of material. The exemplary embodiments are not intended to limit the progress of the wafer 310. In other exemplary embodiments, the wafer 310 may include various layers, or any stages between the beginning and the completion of a product, before the wafer 310 is transferred to the fabrication equipment 320. In the exemplary embodiments, the wafer 310 can be processed by the fabrication equipment 320, 330, 340, 350, as well as overlay measurement equipment 360 in a sequential order.

Figure 12:
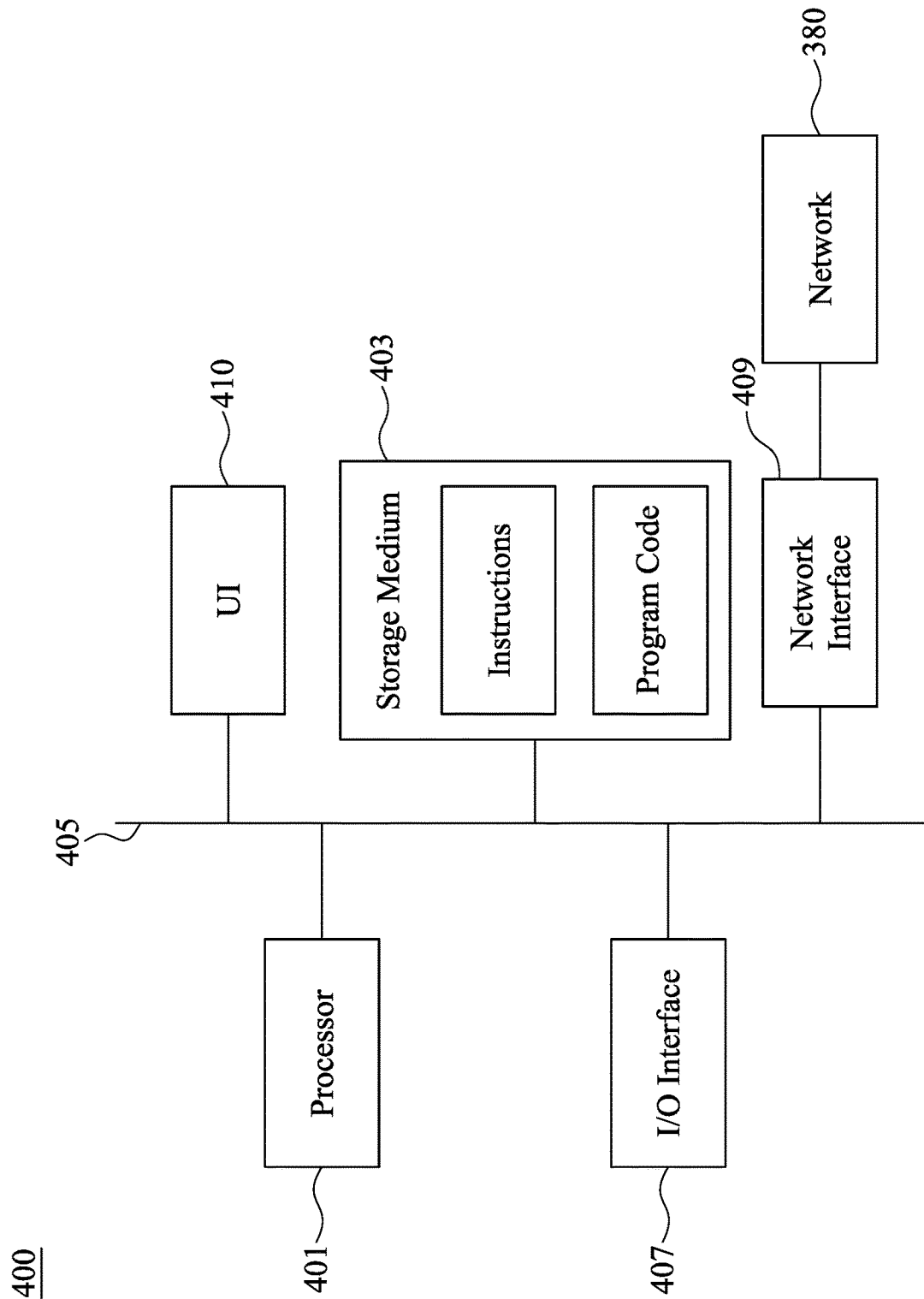
FIG. 12 is a diagram illustrating hardware of a semiconductor fabrication system, in accordance with various aspects of the present disclosure.

FIG. 12 is a diagram illustrating hardware of a semiconductor fabrication system 400, in accordance with various aspects of the present disclosure.

The processes illustrated in FIG. 6 and FIG. 10 may be implemented in the controller 390, or a computing system that organizes the fabrication of a wafer by controlling all or a portion of fabrication equipment in the facility. FIG. 12 is a diagram illustrating hardware of a semiconductor fabrication system 400, in accordance with various aspects of the present disclosure. The system 400 includes one or more hardware processor 401 and a non-transitory computer readable storage medium 403 encoded with, i.e., storing, the program codes (i.e., a set of executable instructions.) The computer readable storage medium 403 may also be encoded with instructions for interfacing with fabrication equipment for producing the semiconductor device. The processor 401 is electrically coupled to the computer readable storage medium 403 via a bus 405. The processor 401 is also electrically coupled to an I/O interface 407 by the bus 405. A network interface 409 is also electrically connected to the processor 401 via the bus 405. The network interface is connected to a network, so that the processor 401 and the computer readable storage medium 403 are capable of connecting to external elements via network 380. The processor 401 is configured to execute the computer program code encoded in the computer readable storage medium 405 in order to cause the system 400 to be usable for performing a portion or all of the operations as described in the methods illustrated in FIG. 6 and FIG. 10.

In some exemplary embodiments, the processor 401 is, but not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 403 is, but not limited to, an electronic, magnetic, optical, electromagnetic, infrared, and/or a semiconductor system (or apparatus or device). For example, the computer readable storage medium 403 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 403 also includes a compact disk-read only memory (CD-ROM), a compact disk-read/write (CD-R/W), and/or a digital video disc (DVD).

In some exemplary embodiments, the storage medium 403 stores the computer program code configured to cause system 400 to perform methods illustrated in FIG. 6 and FIG. 10. In one or more exemplary embodiments, the storage medium 401 also stores information needed for performing the methods illustrated in FIG. 6 and FIG. 10 as well as information generated during performing the methods and/or a set of executable instructions to perform the operation of methods illustrated in FIG. 6 and FIG. 10. In some exemplary embodiments, a user interface 410, e.g., a graphical user interface (GUI), may be provided for a user to operate on the system 400.

In some exemplary embodiments, the storage medium 403 stores instructions for interfacing with external machines. The instructions enable processor 401 to generate instructions readable by the external machines to effectively implement the methods illustrated in FIG. 6 and FIG. 10 during an analysis.

System 400 includes input and output (I/O) interface 407. The I/O interface 407 is coupled to external circuitry. In some exemplary embodiments, the I/O interface 407 can include, but not limited to, a keyboard, keypad, mouse, trackball, track-pad, touch screen, and/or cursor direction keys for communicating information and commands to processor 401.

In some exemplary embodiments, the I/O interface 407 can include a display, such as a cathode ray tube (CRT), liquid crystal display (LCD), a speaker, and so on. For example, the display shows information.

System 400 can also include a network interface 409 coupled to the processor 401. The network interface 409 allows system 400 to communicate with network 380, to which one or more other computer systems are connected. For example, the system 400 may be connected to the fabrication equipment 320, 330, 340, 350, as well as overlay measurement equipment 360 through the network interface 409 connecting to the network 380.

One aspect of the present disclosure provides a semiconductor device. The semiconductor device includes a substrate, a first pattern and a second pattern. The first pattern is disposed on the substrate. The first pattern includes a first segment and a second segment, each of which extends along a first direction. The second pattern is disposed on the first pattern. The second pattern includes a first part extending along a second direction different from the first direction. The first part of the second pattern overlaps the first segment and the second segment along a third direction different from the first direction and the second direction. The first pattern and the second pattern collectively define an overlay error.

Another aspect of the present disclosure provides a semiconductor device. The semiconductor device includes a substrate, a conductive layer, a conducive contact, a first pattern, and a second pattern. The substrate has a first region and a second region. The conductive layer is disposed over the first region of the substrate and at a first horizontal level. The conductive contact is disposed over the conductive layer and at a second horizontal level higher than the first horizontal level. The first pattern is disposed over the second region of the substrate and at the first horizontal level. The second pattern is disposed over the first pattern and at the second horizontal level. The conductive contact has a first dimension, and the second pattern has a second dimension different from the first dimension.

Another aspect of the present disclosure provides a method for manufacturing a semiconductor device. The method includes providing a substrate. The method also includes forming a first pattern on the substrate. The first pattern includes a first segment and a second segment, each of which extends along a first direction. The method further includes forming a second pattern on the first pattern. The second patter includes a first part extending along a second direction different from the first direction. The first part of the second pattern overlaps the first segment and the second segment along a third direction different from the first direction and the second direction. The first pattern and the second pattern collectively define an overlay error.

The embodiments of the present disclosure provide a semiconductor device including an overlay mark structure. The overlay mark structure includes the metallization layers as the pre-layer. The overlay mark structure includes openings, defined by a dielectric layer, as the current layer. The pre-layer and the current layer may be free of systematic error when measuring an overlay error between the M0 layer and the C0 layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
   a substrate;
   a first layer disposed on the substrate, wherein the first layer comprises a first pattern disposed on the substrate, wherein the first pattern comprises a first segment and a second segment, each of which extends along a first direction;
   a second layer disposed on the first layer, wherein the second layer comprises a second pattern disposed on the first pattern, wherein the second pattern comprises a first part extending along a second direction different from the first direction, and the first part of the second pattern overlaps the first segment and the second segment along a third direction different from the first direction and the second direction, and
   wherein the first pattern and the second pattern are associated with an overlay error between the first layer and the second layer and configured to form an overlap mark structure, wherein the overlap mark structure has a first structure portion and a second structure portion, wherein each of the first structure portion and the second structure portion comprises the first pattern and the second pattern;
   wherein the overlay error comprises a first deviation along the first direction via the first structure portion and a second deviation along the second direction via the second structure portion, wherein the first structure portion and the second structure portion measure the first deviation along the first direction and the second deviation along the second direction between the first layer and the second layer on the substrate respectively, so as to precisely align the first layer and the second layer with each other.

2. The semiconductor device of claim 1, wherein the second pattern is disposed above the first pattern, wherein a direction of the first pattern in the first structure portion is different from a direction of the first pattern in the second structure portion, wherein a direction of the second pattern in the first structure portion is different from a direction of the second pattern in the second structure portion.

3. The semiconductor device of claim 2, wherein the first pattern comprises a metallization layer, and the second pattern comprises a hole exposing the metallization layer at an intersection between the first pattern and the second pattern, wherein the hole has a length extending along the first direction and a width extending along the first direction, wherein the width of the hole is greater than the length of the hole,
   wherein the hole of the second pattern is a through hole penetrating through the second layer;
   wherein the direction of the first pattern in the first structure portion is perpendicular to the direction of the first pattern in the second structure portion,
   wherein the direction of the second pattern in the first structure portion is perpendicular to the direction of the second pattern in the second structure portion.

4. The semiconductor device of claim 1, wherein the first part of the second pattern continuously extends across the first segment and the second segment of the first pattern along the second direction.

5. The semiconductor device of claim 1, wherein the first part of the second pattern comprises a first dimension along the first direction and a second dimension along the second direction, and the second dimension exceeds the first dimension.

6. The semiconductor device of claim 1, wherein the second pattern further comprises a second part aligned with the first part along the second direction, and wherein a first distance between the first segment and the second segment of the first pattern along the first direction is greater than a second distance between the first part and the second part of the second pattern along the second direction, wherein a dimension of the first part along the first direction is greater than a distance between the first part and the second part of the second pattern along the first direction.

7. The semiconductor device of claim 6, wherein the second part of the second pattern is free from overlapping the first segment and the second segment of the first pattern along the third direction.

8. The semiconductor device of claim 1, wherein the first pattern is disposed above the second pattern.

9. The semiconductor device of claim 1, wherein the second pattern comprises a metallization layer, and the first pattern comprises a hole exposing the metallization layer, wherein the hole of the first pattern is a through hole penetrating through the first layer.

10. The semiconductor device of claim 1, wherein the first layer is a MO layer and the second layer is a CO layer, such that the CO layer is overlapped on the MO layer.

11. A method of manufacturing a semiconductor device, comprising:

providing a substrate;

forming a first layer having a first pattern on the substrate, wherein the first pattern comprises a first segment and a second segment, each of which extends along a first direction;

forming a second layer on the first layer, wherein the second layer has a second pattern disposed on the first pattern, wherein the second pattern comprises a first part extending along a second direction different from the first direction and a second part aligned with the first part along the second direction, wherein the first part of the second pattern overlaps the first segment and the second segment along a third direction different from the first direction and the second direction, wherein the second part of the second pattern overlaps the first segment and the second segment along the third direction; and precisely aligning the first layer and the second layer with each other via a first deviation along the first direction and a second deviation along the second direction associated with the first pattern and the second pattern;

wherein the first layer is a MO layer and the second layer is a CO layer, such that the CO layer is overlapped on the MO layer;

wherein the first pattern comprises a metallization layer, and the second pattern comprises a hole exposing the metallization layer at an intersection between the first pattern and the second pattern, wherein the hole has a length extending along the first direction and a width extending along the first direction, wherein the width of the hole is greater than the length of the hole, wherein the hole of the second pattern is a through hole penetrating through the second layer.

\* \* \* \* \*